United States Patent [19]

Fang et al.

[11] Patent Number: 4,939,563

[45] Date of Patent: Jul. 3, 1990

[54] DOUBLE CARRIER DEFLECTION HIGH SENSITIVITY MAGNETIC SENSOR

[75] Inventors: Frank F. Fang, Yorktown Heights; Denny D. Tang, Pleasantville, both of N.Y.

[73] Assignee: IBM Corporation, Armonk, N.Y.

[21] Appl. No.: 395,836

[22] Filed: Aug. 18, 1989

[51] Int. Cl.$^5$ .................... H01L 27/22; H01L 29/82; H01L 29/96; H01L 43/00

[52] U.S. Cl. ........................................ 357/35; 357/27; 357/38; 307/304

[58] Field of Search .................... 357/27, 35, 36, 38; 307/304

[56] References Cited

U.S. PATENT DOCUMENTS

| | | | |
|---|---|---|---|
| 3,389,230 | 6/1968 | Hudson | 179/100.2 |
| 3,668,439 | 6/1972 | Fujikawa et al. | 307/309 |
| 3,997,909 | 12/1976 | Vinal | 357/27 |
| 4,048,648 | 9/1977 | Vinal | 357/27 |
| 4,100,563 | 7/1978 | Clark | 357/27 |
| 4,129,880 | 12/1978 | Vinal | 357/27 |
| 4,163,986 | 8/1979 | Vinal | 357/27 |
| 4,276,555 | 6/1981 | Vinal | 357/13 |
| 4,288,708 | 9/1981 | Vinal | 307/309 |
| 4,291,319 | 9/1981 | Carinalli | 357/13 |
| 4,684,970 | 4/1987 | Sloane et al. | 357/35 |
| 4,689,648 | 8/1987 | Vinal | 357/27 |
| 4,700,211 | 10/1987 | Popovic et al. | 357/27 |
| 4,750,028 | 6/1988 | Ludikhuize | 357/52 |

OTHER PUBLICATIONS

Beresford, "Magnetic Transistors Exploit New Theory of Carrier Modulation", *Electronics Review*, May 19, 1982.

Ristil et al., "A Lateral Magnetotransistor . . . ", *Trans on Electron Dev*, vol. 36, #6, Jun. 89.

*Primary Examiner*—Andrew J. James
*Assistant Examiner*—Stephen D. Meier
*Attorney, Agent, or Firm*—Peter L. Michaelson

[57] ABSTRACT

Apparatus for a bipolar active semiconductor magnetic field sensor that has a higher sensitivity than semiconductor field sensors presently existing in the art. Specifically, the inventive sensor utilizes a semiconductor structure containing a single emitter layer, a single base layer that is overlaid over the emitter layer and two separate oppositely situated collectors located above the base layer. A bias lateral majority carrier flow is established, in preferably and respectively both the base and emitter layers (electrons in the emitter, holes in the base), that flows in opposite directions in these layers and is oriented normal (transverse) both to the direction of transistor current and to the direction of a magnetic field that is to be detected. When the magnetic field is applied to the sensor, this field imparts a Lorentz force to these carriers which causes these majority carriers to deflect in the same direction in both the emitter and base layers, respectively. The resulting deflection of these carriers, in turn, produces local Hall effect voltages, that are proportional to the strength of the magnetic field, across the emitter-base junction that locally increases the forward bias of this junction near one collector and locally decreases the forward bias of this junction near the other collector so as to exponentially increase the collector current flowing through one collector while exponentially decreasing the collector current flow through the other collector. Inasmuch as the exponential collector current flow is a very sensitive function of emitter-base voltage, the inventive sensor is substantially more sensitive than semiconductor sensors known in the art.

18 Claims, 4 Drawing Sheets

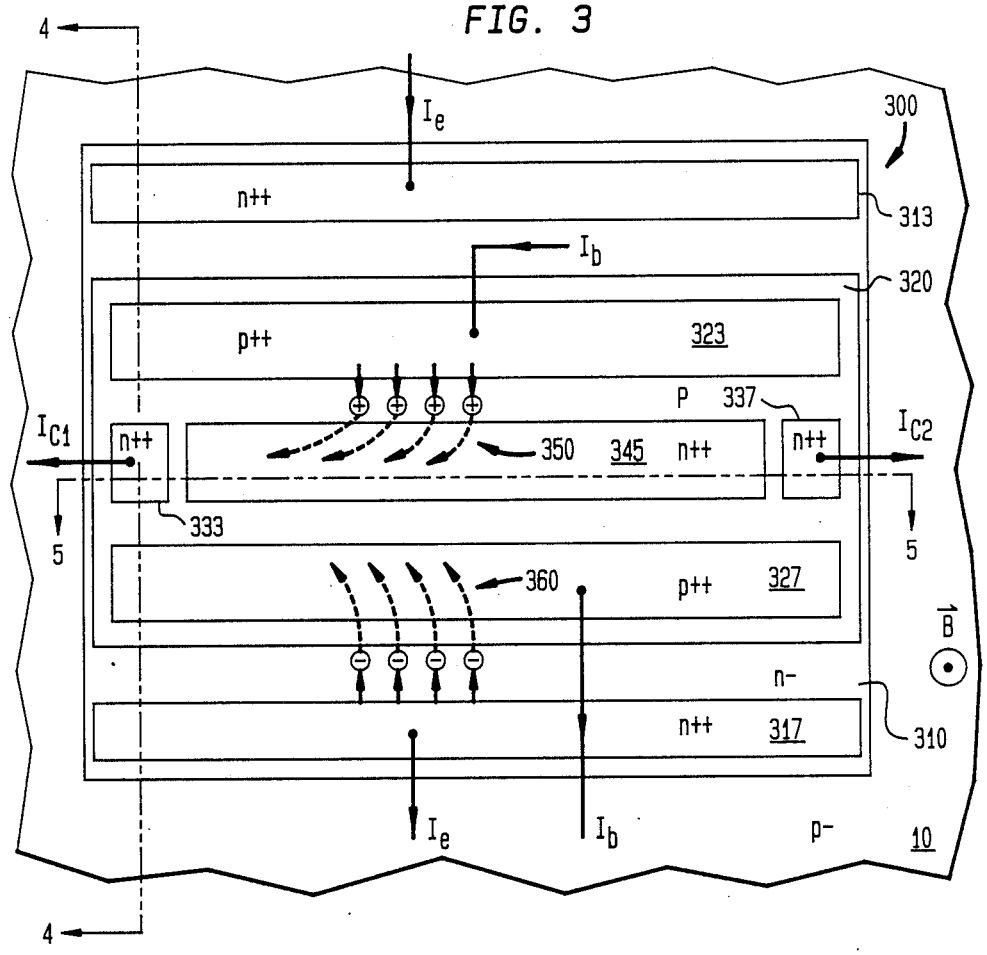
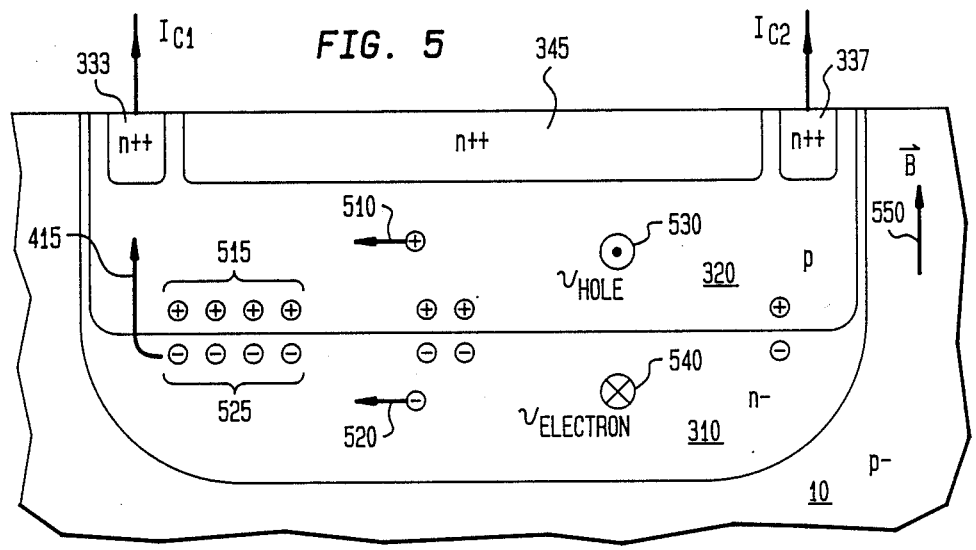

DOUBLE CARRIER DEFLECTION HIGH SENSITIVITY MAGNETIC SENSOR

BACKGROUND OF THE INVENTION

1. Field of the Invention

The invention relates to apparatus for a bipolar active semiconductor magnetic field sensor that has a higher sensitivity than semiconductor field sensors presently existing in the art.

2. Description of the Prior Art

Over the past two decades, increasing processor sophistication along with increasingly sophisticated available application software has permitted computer systems, particularly personal computers and other microcomputer based systems, to manipulate vastly increased amounts of data than has heretofore been possible. For many years, magnetic storage media has provided an economical way to store increasingly large and substantial amounts of data. This, in turn, has fueled the growth and evolution of disk drives such that over the years disk drives have been able to provide substantially increased storage capacities at a continually decreasing cost/megabyte of stored data while keeping the overall housing of the drive at a relatively constant physical size, e.g. within a conventional "full-" or "half-" height drive bay. Clearly, the ongoing evolution of processors and accompanying application software will no doubt continue to force the development of disk drives that provide even greater storage capacities than that currently available without any increase in the physical size of the drive itself.

The capacity of a hard disk drive can be increased using either one of two methods: incorporating additional disk platters within the drive or increasing the storage capacity of each disk used within the drive. Each method possesses various shortcomings that limits its effectiveness.

First, each platter in a hard disk drive is read by at least one read head that is mounted to an end of an arm that is selectively moved in a radial direction from track to track in order to read data stored within a desired track. In a multi-platter drive, certain of these arms are situated between individual platters. In use, each arm maintains its associated read head in a position that is slightly above, but by only small fraction of a centimeter, the surface of a corresponding rotating platter. To a certain extent, these arms can be made smaller, at least in a transverse direction (i.e. the "height" of the arm as measured between adjacent disk platters), such that an increased number of platters can be stacked on a common drive spindle and housed within a single enclosure. Unfortunately, each arm which typically moves, generally on an incremental or stepped basis, at a relatively high velocity, from, for example, the innermost track to the outermost track on the disk in a few tens of milliseconds if not less, must concomitantly withstand significant physical forces in order to position the read head over a desired track in the least amount of time while ensuring that the head does not contact the surface of its corresponding platter and otherwise cause a "disk crash". Unfortunately, re-designing these arms to continually miniaturize their transverse size is a costly and tedious process and, in the absence of utilizing new and generally expensive alloys that provide increased strength and reduced weight, is also quite difficult.

Second, the storage capacity of a disk drive can be increased by either essentially using a new disk containing a different magnetic media, i.e. a magnetic coating used in a hard disk platter or a floppy diskette, that can store data at a finer resolution than that previously used along with a concomitant change in the read head(s) used within this drive to one that will support this finer resolution or, if the media on an existing disk or platter can support this finer resolution, then essentially changing the read head(s) accordingly. Developing new coatings with increasingly fine storage resolution has proven to be a tedious, extremely difficult and very expensive task. Now, assuming that the magnetic media appearing on existing platters and/or disks can itself inherently store data at a finer resolution than is currently being used by a given read head(s)—which is often the case, then changing the read head(s) to one that uses a magnetic pickup that operates at this finer resolution will impart an increased storage capacity for a disk drive that utilizes this media.

Unfortunately, using read heads having an increasingly fine resolution has been problematical. In particular, magnetic pickups, that have been traditionally used with magnetic disk drives, incorporate a coil of wire as the magnetic sensing element. While coils can be miniaturized, through thin film techniques, use of coil based pickups suffer a number of drawbacks. First, coils can not detect a static magnetic field but only flux changes. Consequently, data on a stationary disk can not be read with such a coil based pickup. For this reason, a disk must be continuously rotated whenever such a pickup is being used to read any disk stored thereon. Furthermore, merely rotating the disk is not sufficient. The rotational speed of a drive must be controlled rather accurately and within relatively fine tolerances such that the rotational speed does not vary by more than an insignificant differential amount from a nominal value either over time for any given drive or from one drive to another. In particular, since a coil detects flux changes, any variation in rotational speed will likely increase or decrease the voltages generated by the pickup from nominal values for both "1" and "0" digital levels whenever the pickup traverses over an area containing a stored data pattern. Hence, if the rotational speed of a drive either permanently lies outside of these tolerances or has a variation that exceeds these tolerances, then the data stored on a disk that has been inserted into that drive and is being read thereby may be erroneously interpreted by that drive and hence cause erroneous and/or unexpected operation of a computer that uses data supplied by that drive. Therefore, to ensure that disks are correctly read by the same or different drives, each drive must contain sufficient circuitry that provides the necessary degree of long term stable control over the rotational speed of the drive. Unfortunately, the use of such circuitry adds to the cost of the drive. Second, as the size of the coil is reduced, its sensitivity also decreases. Therefore, to obtain acceptable output signals with a sufficiently low noise content, a limit exists on the size to which the coil can be miniaturized. This limit restricts the resolution of the pickup and, in turn, limits the density of the data that can be stored on a disk that is to be read with this pickup and as well as the storage capacity of any disk drive that utilizes this pickup.

In an attempt to overcome the drawbacks associated with coil based magnetic pickups, the art teaches the use of semiconductor magnetic field sensors.

One class of such sensors is the so-called "deflection" type sensor. These sensors, characterized by that shown in illustratively U.S. Pat. Nos. 4,700,211 (issued on Oct. 13, 1987 to Popovic et al); 4,100,563 (issued on July 11, 1978 to Clark); and 3,389,230 (issued on June 18, 1968 to Hudson, Jr.) rely on establishing a quiescent single, typically majority, carrier base current in the absence of a magnetic field in a semiconductor structure that has a single emitter and two opposing collectors situated on the base. In the presence of a magnetic field applied normal to the direction of current flow, a Lorentz force imparted to the majority carriers, here electrons, will cause a portion of these carriers to be deflected and move towards one collector in lieu of the other, based upon the polarity of the field, in a direction that is itself perpendicular to the current flow and to the applied magnetic field. As such, these devices utilize the well known "Hall effect" to deflect the carriers between the two collectors. The strength of the field is proportional to the difference in the amount of current produced by each of the two collectors. Similarly, U.S. Pat. No. 3,668,439 (issued June 6, 1972 to Fujikawa et al) discloses a semiconductor device that has a single collector and two separate emitters diffused in a common base area in which a differential amount of current flows as a result of the Hall effect from the base region to the two emitters in order to forward bias one of the emitters. An output is taken from the collector that is adjacent to the forwardly biased emitter. Other deflection type sensors are illustratively shown in U.S. Pat. No. 4,163,986 (issued Aug. 7, 1979 to Vinal) and 4,129,880 (issued Dec. 12, 1978 to Vinal), both of which are assigned to the present assignee.

Hall effect sensors that also rely on carrier deflection are also described in U.S. Pat. Nos. 4,048,648 (issued to Vinal on Sept. 13, 1977—henceforth referred to as the '648 Vinal patent) and 3,997,909 (issued to Vinal on Dec. 14, 1976—henceforth referred to as the '909 Vinal patent), both of which are also assigned to the present assignee. The '909 Vinal patent describes a sensor in which a semiconductor having a sheet resistance of greater than or equal to 500 Ω/square has two electrodes at opposing surfaces thereof with two spaced apart contacts situated perpendicular to the direction of single charge carriers (current) flow through the substrate. An electric field of at least 500 volts/centimeter is applied across the electrodes and hence across the substrate to establish equi-potential electric field lines and current flow within the substrate. A magnetic field that is to be detected is applied perpendicular both to the substrate and to the direction of current flow therein. The application of the external field rotates the equi-potential lines that exists within the substrate and hence causes a change in the voltage that appears between each of two contacts and ground. A similar sensor in the context of a field effect transistor (FET) device is shown in the '648 Vinal patent.

A second and different class of semiconductor magnetic sensors is the so-called "avalanche effect" type sensor. Here, these sensors characterized by that shown in U.S. Pat. Nos. 4,288,708 (issued on Sept. 8, 1981 to Vinal) and 4,276,555 (issued on June 30, 1981 to Vinal), both of which are also assigned to the present assignee, rely on use of an external magnetic field to modulate a controlled avalanche effect. Specifically, certain transistor structures exhibit sudden avalanche breakdown at a given collector-base voltage at which impact ionization occurs. The voltage at which avalanche breakdown occurs in such a structure can be bi-directionally varied by the application of an external magnetic field applied transverse to the plane of a substrate of the structure, with the direction of the variation being governed by the polarity of the applied field. Through the use of dual opposing collectors, a local avalanche voltage for one collector will increase in response to the applied field while that voltage will decrease for the other collector. As a result, a differential collector voltage will be generated that is proportional to the applied field, with the polarity of this differential voltage being dependent upon the polarity of the applied field.

With the above description in mind, one skilled in the art quickly recognizes that semiconductor magnetic sensors are capable of detecting a static field. Therefore, use of these sensors advantageously eliminates the need to accurately control the speed of a rotating disk which, in turn, can reduce the cost of a disk drive that utilizes such a sensor.

Furthermore, since semiconductor sensors only utilize integrated semiconductor structures, these sensors can be made much smaller than coil based pick-ups and thereby can detect a smaller magnetized area on a magnetic media than that destined for use a coil based pickup thereby providing an significant increase in the storage capacity of a disk used with such a sensor. In addition, semiconductor sensors are easy and rather inexpensive to fabricate.

Unfortunately, known semiconductor magnetic sensors, whether of the "deflection" or "avalanche effect" type, suffer from one or more drawbacks. "Deflection" type sensors exhibit a very low sensitivity to, a detected magnetic field. Although "avalanche effect" type sensors possess increased sensitivities over that provided by "deflection" type sensors, "avalanche effect" sensors disadvantageously suffer from other drawbacks. First these sensors exhibit avalanche induced noise. Second, the avalanche phenomena is highly non-linear and, for that reason, renders any device, such as a sensor, that relies on its use very difficult to control. Third, once a local avalanche occurs, such as in the vicinity of one collector, that avalanche must be quenched prior to the next use of the sensor. As such, an "avalanche effect" type sensor requires a finite amount of recovery time that disadvantageously limits the response and bandwidth of the sensor.

Given these drawbacks, one can readily appreciate that use of a "deflection" type sensor would be favored over use of an "avalanche effect" type sensor. However, since "deflection" type sensors known in the art are not sufficiently sensitive to a detected magnetic field, coil based pickups continue to be widely used in the art even in view of the finer detection resolution available through semiconductor sensors.

Thus a need exists in the art for a semiconductor magnetic field sensor that possesses a higher sensitivity than do magnetic sensors heretofore known in the art, specifically both coil and semiconductor types. Use of such a sensor in a read head of a disk drive, with a disk that is capable of storing data at a finer resolution over that at which it is presently being used with a coil type pickup, would advantageously enable that the disk to store data at an increased density over that obtainable with a coil type pickup and thereby substantially increase the storage capacity of the drive. In addition, since such a sensor is capable of detecting a static field and thereby eliminates the need for accurate speed control of the disk and would also be rather inexpensive to fabricate, use of such a sensor might likely reduce the manufacturing cost of the drive.

SUMMARY OF THE INVENTION

Accordingly, an object of the present invention is to provide a semiconductor magnetic field sensor that has a higher sensitivity to a detected magnetic field than does magnetic sensors, both coil and semiconductor types, known in the art.

Another specific object is to provide such a sensor that does not rely on avalanche breakdown and thus does not suffer from the drawbacks inherent in an "avalanche effect" type sensor.

Another specific object is to provide such a sensor that is capable of detecting a static magnetic field, thereby reducing or even eliminating the need to accurately control the rotational speed of a disk drive.

Another specific object is to provide such a sensor that is simple and inexpensive to fabricate.

These and other objects are accomplished in accordance with the teachings of our inventive magnetic sensor which has: an emitter region with two emitter connections associated therewith for establishing a bias lateral majority carrier (electrons) flow therethrough, wherein the bias lateral majority carrier flow is oriented substantially perpendicular to both a direction of a magnetic field that is to be detected with the sensor and to a direction of transistor current that will flow through the sensor; a base region adjoining at least a portion of the emitter region so as to form an emitter-base junction with a junction voltage occurring therebetween, the base region having two base connections associated therewith for establishing a bias lateral majority carrier flow (in this case holes) therethrough, wherein the bias lateral majority carrier flow in the base region is oriented substantially opposite to the direction to the bias majority carrier flow in the emitter region and substantially perpendicular to both the direction of the magnetic field and to the direction of the transistor current; first and second collector regions oppositely situated on the base region, whereby, when the magnetic field is applied to the sensor in the presence of both of the bias lateral majority carrier flows, both of the bias lateral majority carrier flows will deflect, due to a Lorentz force imparted by the field to these carriers, in substantially the same direction so as to locally increase the junction voltage located in a vicinity of the first collector region and decrease the junction voltage located in a vicinity of the second collector region thereby exponentially increasing the collector current that will flow through &.he first collector region and exponentially decreasing the collector current that will flow through the second collector region. The change in junction voltage arises due to hole and electron Hall effect voltages that are locally formed on opposite sides of the emitter-base junction due to application of the external magnetic field and specifically a component of that field that is oriented substantially parallel to the direction along which transistor current will flow in the sensor. Inasmuch as the differential collector current produced by our inventive sensor exponentially varies as a function of the local Hall effect voltages generated by the external magnetic field, our sensor is advantageously substantially more sensitive to magnetic field strength than prior art devices, which generally produce a differential current that linearly varies with the Hall effect voltages produced by the field.

In accordance with a preferred embodiment of the invention, a floating region is located on the base region intermediate the two collectors. This floating region, which typically is fabricated from a semiconductor material having the same conductivity type as the collectors, serves to increase the current density of the bias lateral majority carrier flow in the base region thereby increase the Hall effect field associated therewith thereby which, in turn, further increases &.he sensitivity of our inventive sensor. The floating region also serves to physically passivate the otherwise exposed base region situated between the two collectors.

BRIEF DESCRIPTION OF THE DRAWINGS

The teachings of the present invention may be readily understood by considering the following detailed description in conjunction with the accompanying drawings, in which:

FIG. 3 depicts a top view of a preferred embodiment of our inventive semiconductor magnetic field sensor;

FIG. 5 depicts a cross-sectional view of the sensor shown in FIG. 3 and taken along lines 5—5 shown therein;

To facilitate reader understanding, identical reference numerals have been used, where possible, to denote identical elements that are common to the figures.

DETAILED DESCRIPTION

To fully understand the present invention, this following discussion will first describe a typical conventional "deflection" type semiconductor sensor known in the art and will then describe, in detail, our inventive sensor.

Figure 1:
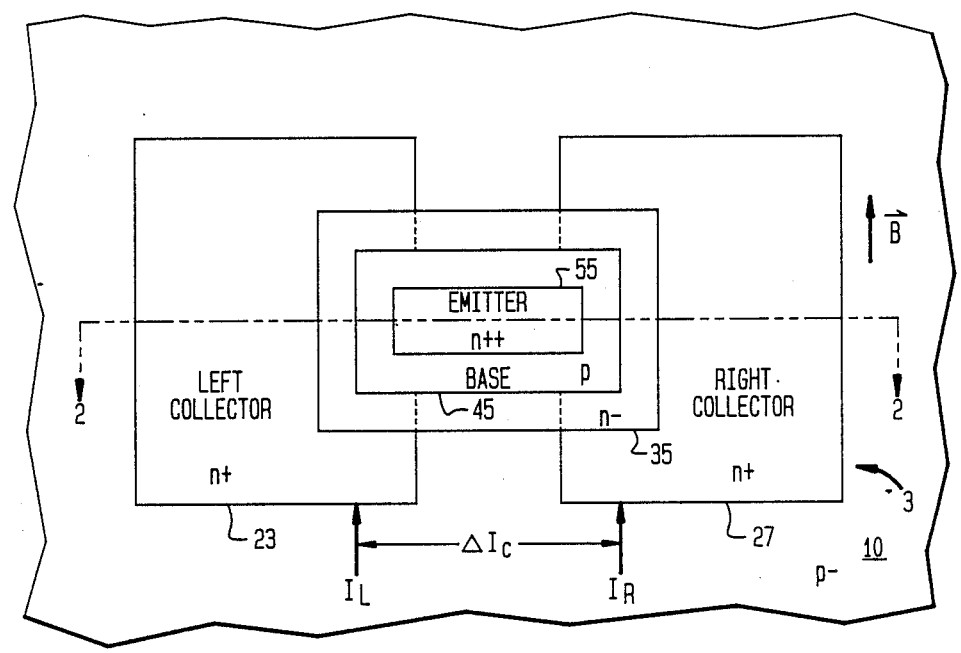
FIG. 1 depicts a top view of a typical conventional "deflection" type semiconductor magnetic sensor that is known in the art.
Figure 2:
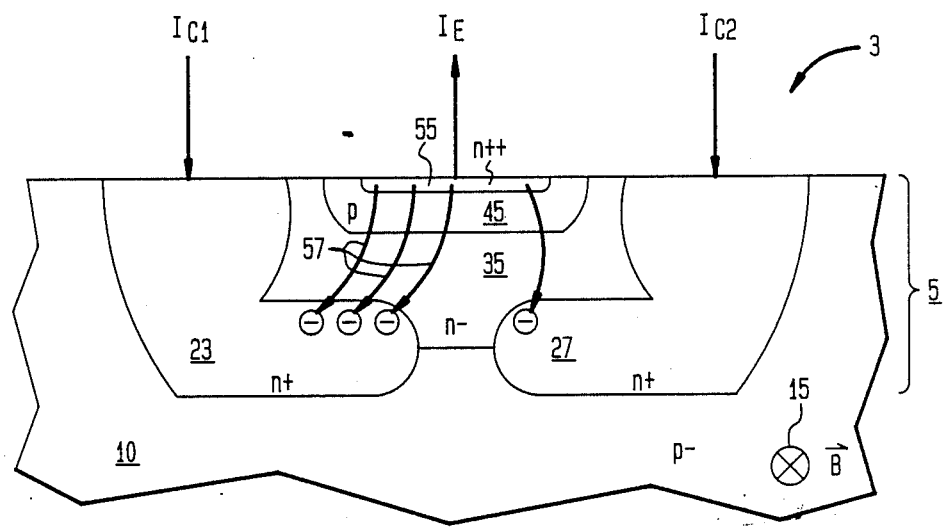
FIG. 2 depicts a cross-sectional view of the sensor shown in FIG. 1 and taken along lines 2—2 shown therein.

FIGS. 1 and 2 depict a top view and a cross-sectional view, the latter being taken along lines 2—2 shown in FIG. 1, of conventional "deflection" type semiconductor magnetic sensor 3 that is known in the art. This sensor consists of vertical n-p-n transistor 5 fabricated in p− type substrate 10. This transistor is formed with n++ type emitter region 55, p type base region 45, and n+ type sub-collectors 23 and 27. N− region 35 is a common collector region that isolates heavily doped sub-collectors 23 and 27 from the base region and also provides a relatively large conduction path for the majority carriers that flow to the sub-collectors.

The individual semiconductor layers that form this transistor as well as the inventive sensor, as discussed in detail below, are generally a few thousand angstroms wide and are well-known in the semiconductor art and typical of those currently used in integrated circuits. These layers are produced through any one of a variety or well known currently used silicon very large scale integration (VLSI) fabrication techniques, such as illustratively ion implantation or diffusion. In view of this knowledge in the art and to simplify the following discussion, the constituents of these layers and the manner in which they are manufactured will not be discussed any further.

In use, the prior art sensor shown in FIGS. 1 and 2 is biased by well-known circuitry (not shown) such that a prescribed current flows in the device such that electrons flow from the emitter through the base to each of the two sub-collectors. In the absence of a magnetic field, an approximately equal amount of carriers will flow to each one of sub-collectors 23 and 27 thereby resulting in a differential collector current, $\Delta I_C$, of approximately zero. Now, when this prior art device is exposed to a magnetic field that is perpendicular to the plane of the paper, as shown in FIG. 2, and thus normal to the direction of carrier flow occurring within the sensor, the electrons will deflect, as a result of a Lorentz force imparted to each electron, either to the left or right as shown in FIG. 2, depending upon the direction of the applied field. As a result, more current will flow through one of the sub-collectors than the other with the amount of differential current being proportional to the strength of the applied field. For example, if the magnetic field is illustratively directed, as shown by arrow tail 15, into the plane of the figure, then base minority carriers 57, as represented by the symbol "$\theta$", will be deflected towards the left. Hence, left sub-collector 23 will produce a larger collector current, $I_{C1}$, than that, $I_{C2}$, produced by right sub-collector 27. Alternatively, if the field is oriented in the opposite direction to that shown by arrow tail 15, then right collector current $I_{C2}$ will exceed left collector current $I_{C1}$ with the amount of the differential collector current ($\Delta I_C = I_{C1} - I_{C2}$) being proportional to the field strength.

Inasmuch as no lateral base current flows in this prior art device, no current amplification is provided. Furthermore, the amount of carrier deflection caused by an applied magnetic field is limited by the initial transistor bias current and is generally quite small. Consequently, the prior art "deflection" sensor shown in FIG. 1 generally exhibits a very low sensitivity to an applied magnetic field and, for that reason, has been viewed as being unsuitable for use as a magnetic sensor in a disk drive.

The deficiencies associated with the semiconductor magnetic field sensors known in the art and typified by that shown in FIGS. 1 and 2 are advantageously reduced, if not eliminated, by our inventive sensor.

Figure 4:
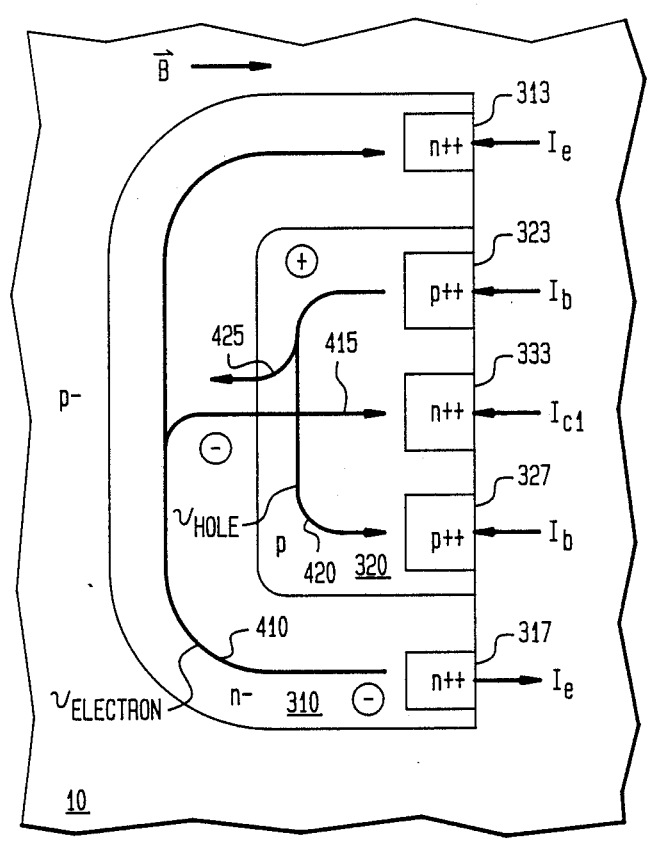
FIG. 4 depicts a cross-sectional view of the sensor shown in FIG. 3 and taken along lines 4—4 shown therein.

FIG. 3 depicts a top view of a preferred embodiment of our inventive semiconductor magnetic field sensor 300, with FIGS. 4 and 5 depicting cross-sectional views of this sensor and respectively taken along lines 4—4 and 5—5 shown in FIG. 3. In particular as shown in FIGS. 3 and 4, sensor 300 is illustratively fabricated on p— type substrate 10. This sensor contains n— type emitter region 310, p type base region 320 overlying the emitter region, n++ type collectors 333 and 337 and n++ type floating region 345 all overlying the base. These collectors are preferably located, as shown in FIG. 3, in the vicinity of oppositely situated edges of base layer 320. Since the base layer situated under collectors 333 and 337 has a lower dopant density than either of these collectors, the collector and base layers are easily fabricated using conventional processes without the need to include a sub-collector. N++ type connections 313 and 317 are used to route emitter bias lateral current $I_e$ through emitter layer 310; while p++ type connections 323 and 327 are used to route base bias lateral current $I_b$ through base region 320. The two collectors and the floating region are all co-located between base bias connections 323 and 327.

Our inventive sensor advantageously achieves a substantially higher sensitivity than the semiconductor sensors known in the art. This occurs, in accordance with the teachings of our invention, by establishing a bias lateral current flow of majority carriers in preferably and respectively both the base and emitter regions (holes in the base, electrons in the emitter) that, in the absence of an externally applied magnetic field, flows in opposite directions in these layers and is oriented normal (transverse) to the transistor current (current flow through the emitter-base junction). Now, when such a magnetic field is applied to sensor 300 in a direction that is transverse (normal) to the lateral bias current, this field imparts a Lorentz force to these carriers which causes these majority carriers to deflect in the same direction in the base and emitter layers. Thus, the lateral bias current flows in a direction that is normal to both the transistor current and to the magnetic field that is to be detected. However, the transistor current flows in a direction that is substantially parallel to the magnetic field and particularly to one component of the field, e.g. the vertical component, that is to be detected. In any event, the resulting deflection of the majority carriers in both the base and emitter (henceforth referred to as "double carrier deflection"), in turn, produces local Hall effect voltages, that are proportional to the field strength, across the emitter-base junction that locally increases the forward bias of this junction near one collector and locally decreases the forward bias of this junction near the other collector so as to exponentially increase the collector current flowing through one collector while exponentially decreasing the current flow through the other collector. This, in turn, imparts a "push-pull" effect (typically associated with a conventional power amplifier) onto the voltage which appears across these two collectors and is differentially detected, as described below, to produce an output voltage. Inasmuch as the exponential collector current flow is a very sensitive function of emitter-base voltage, our inventive sensor is substantially more sensitive than the prior art device shown in FIGS. 1 and 2. Inasmuch as small changes in the Hall effect voltage caused by the external magnetic field produce substantial changes in differential collector current, our inventive sensor is an active device. Our inventive sensor could also function if a suitable bias lateral majority carrier current flows in only the base or emitter region, but not both, with the carriers associated with this lateral bias current being deflected by an external magnetic field (henceforth referred to as "single carrier deflection"). However, the resulting "single carrier deflection" device, though still substantially more sensitive than the prior art devices, would be less sensitive than a sensor that uses our "double carrier deflection" technique.

Specifically, as shown in FIGS. 3, bias voltage is applied across the emitter and base layers through connections 313 and 317, and 323 and 327 to cause majority carriers (electrons) to flow in emitter layer 310 from emitter connections 317 to 313 and majority carriers (here holes) to flow in base layer 320 from base connections 323 to 327. In the absence of an externally applied magnetic field, these majority carriers flow in opposite directions in the emitter and base layers, as indicated by symbols 530 and 540 in FIG. 5 and by lines 410 and 420 shown in FIG. 4. The hole flow is designated by "$v_{hole}$"; while the electron flow is designated by "$v_{electron}$".

Now, if an external magnetic field or a component thereof is applied, in the direction illustratively indicated by arrow 550 shown in FIG. 5 (to simplify the following discussion the applied magnetic field will be assumed hereinafter to only have one component oriented in the direction shown in the figures), to sensor 300, then both the lateral bias flow of majority carriers (electrons) in emitter layer 310 and the majority carriers (holes) in base layer 320 would be subjected to a Lorentz force. This force would cause these majority carriers in both the base and emitter regions to be deflected in the same direction, illustratively to the left, as shown by arrow 510 for an illustrative hole, as represented by the symbol "⊕", in the base and arrow 520 for an illustrative electron, as represented by the symbol "⊖", in the emitter. This deflection is also indicated by the dashed lines in FIG. 3 showing movement of holes 350 and electrons 360 towards collector 333. Consequently, the majority carriers would be deflected and tend to accumulate ("bunch") on the left side of the emitter-base junction, as indicated by holes 515 and electrons 525 shown in FIG. 5, and be depleted from the right side of this junction. As shown in this figure, the left side of this junction is situated essentially below collector 333; while the right side of this junction is situated essentially below collector 337. As a consequence of this carrier bunching, a total Hall effect voltage, with separate contributions resulting from the Hall effect voltage caused by electron flow ($V_H$(electron)) and hole flow ($V_H$(hole)), would be developed across this junction which would tend to de-bias the left side of this junction while increasing the bias voltage across the right side of this junction. As such, due to the magnetic field, the quiescent point would shift in opposite directions on the right and left sides of this junction. The change in emitter-base junction voltage ($\Delta V_{be}$) between the left and right sides of this junction and attributable to the total Hall effect voltage would be given by the following equation, with the Hall effect voltage for the holes or electrons being proportional to the cross-product of the magnetic field strength and the current density of the corresponding bias majority carrier:

$$\Delta V_{be} = V_{be}(left) - V_{be}(right) = V_H(electron) + V_H(hole) \quad (1)$$

With equal bias current density flowing through the emitter and base layers and assuming approximately equal carrier densities, the Hall effect voltage ($\Delta V$) for an electron will essentially equal that for a hole. As such, equation (1) can be re-written as:

$$\Delta V_{be} = 2\Delta V \quad (2)$$

Collector current in a bipolar transistor is proportional to an exponential function of the base-emitter voltage, as given by the following equation:

$$I_C \alpha\ e^{(V_{be}/V_t)} \quad (3)$$

where:
$V_t$ equals the volt equivalent of temperature (T/11,600) and is a constant value for a given temperature (T expressed in degree Kelvin).

Therefore, it is immediately apparent that any change in emitter-base voltage would generate an exponential change in collector current. In the absence of an applied magnetic field, the emitter-base voltage would be constant across the entire emitter-base junction shown in FIG. 5. As such, the collector current would be given by equation (3) with $V_{be}$ equalling the emitter-base bias voltage. Accordingly, an equal amount of collector current would flow through both collectors 333 and 337 thereby yielding no net differential collector current ($\Delta I_C = I_{C1} - I_{C2}$) therebetween. As such, a differential voltage output taken between these two collectors would be zero, as expected.

However, in the presence of an external magnetic field, the emitter-base voltage for the left side of the emitter-base junction shown in FIG. 5 would increase by $2\Delta V$, and decrease by the same amount for the right side of this junction, thereby producing a differential emitter-base junction voltage. Hence, the collector current, $I_{C1}$, as indicated by line 415 in FIGS. 4 and 5, associated with collector 333 would be given by:

$$I_{C1} \alpha\ e^{((V_{be} + 2\Delta V)/V_t)} \quad (4)$$

while the collector current, $I_{C2}$, associated with collector 337 would be given by:

$$I_{C2} \alpha\ e^{((V_{be} - 2\Delta V)/V_t)} \quad (5)$$

In the presence of the external magnetic field as shown in FIG. 4, a small incremental base current would flow from base connection 323 into emitter region 310 as symbolized by line 425. Consequently, through transistor action, this base current would be amplified by a factor, $\beta$, at collector 333.

Thus, the differential collector current produced by our inventive sensor is an extremely sensitive exponential function of the local Hall effect voltages generated by the external magnetic field. This sensitivity is to be compared with a sensitivity that is a linear function of the magnetic field as is produced by the prior art devices.

Clearly, the direction of the differential collector flow would depend upon the direction of the applied magnetic field and hence would be opposite from that described above if the magnetic field occurred in a direction opposite to that shown by arrow 550 in FIG. 5. In addition, if a sensor were to be fabricate using our "single carrier deflection" technique, then the same analysis as that described above would govern the operation of the sensor with the exception that the term $V_H$(electron) or $V_H$(hole) would be zero depending upon which charge carrier was not flowing under normal bias conditions.

The performance of our inventive sensor can be advantageously enhanced through two methods. First, as noted, the Hall field is proportional to the current density of the charge carriers As such., floating layer 345, which is typically an n++ layer situated within base region 320, increases the current density of the bias lateral majority carrier flow occurring in the base which, in turn, concentrates deflected majority carriers that flow in the base layer towards either collector in the presence of an external magnetic field thereby increasing the hole Hall voltage $V_H$(hole) appearing in the base and hence the differential emitter-base junction voltage. Furthermore, this floating layer also physically passivates the base region that is situated between the two collectors and would otherwise, i.e. in the absence of the floating layer, be exposed.

Figure 6:
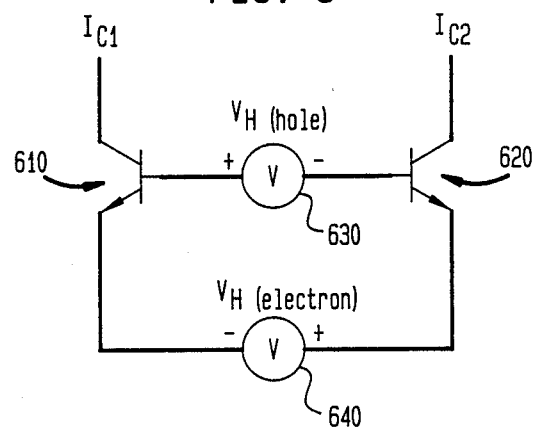
FIG. 6 shows a simple equivalent circuit for our inventive sensor.

FIG. 6 shows a simple equivalent circuit, in the absence of any external bias voltages, of our inventive sensor. As can be seen from this circuit, our sensor can be seen as two n-p-n transistors 610 and 620 with voltage source 630, i.e. hole Hall voltage $V_H$(hole), developed across the bases and voltage source 640, i.e. electron Hall voltage $V_H$(electron), applied across the emitters.

Figure 7:
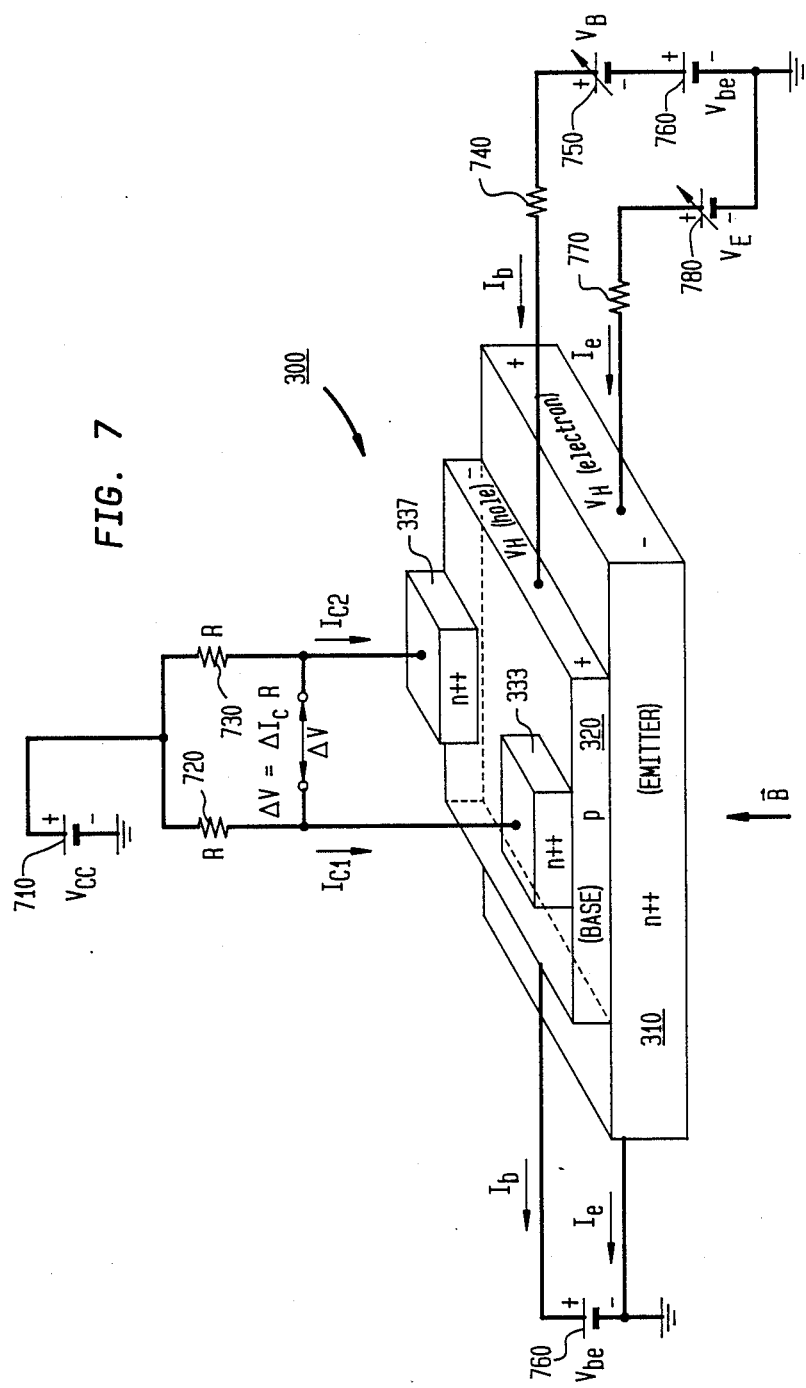
FIG. 7 shows a simplified perspective view of the preferred embodiment of our inventive sensor along with basic associated bias and output circuitry.

With the above in mind, FIG. 7 shows a simplified perspective view of the preferred embodiment of our inventive sensor along with basic associated bias and output circuitry. As shown, a lateral emitter bias current flowing transverse to both the direction of an applied magnetic field and to collector current is established using variable voltage source 780 and limited by emitter resistor 770. A lateral base bias current also flowing transverse to both the direction of an applied magnetic field and to collector current is established using variable base source 750 and limited by emitter resistor 740, with the emitter-base junction voltage being represented by voltage sources 760. Collector current would be established through a common collector voltage $V_{CC}$ generated by voltage source 710 and applied through load resistors 720 and 730 to individual collectors 333 and 337, respectively. These two load resistors would be equal in value, R; however, the nominal value of each resistor is not critical and would be set to provide an appropriately safe level of collector current. The output of the inventive sensor would be taken as differential collector voltage $\Delta V_C$ which would equal the product of the differential collector current flow, $\Delta I_C$, and value R.

Although the inventive sensor has been described in terms of being implemented with n-p-n transistors and specific layers therein, the dopant levels of the substrate and these layers can be varied to produce a different substrate and different layers, as desired. For example, the connections to the emitter and base regions need not be n++ type and p++ type but can instead by simply n+ and p+ types, respectively. Moreover, the base can be p− type in lieu of p type, and the emitter can be n type instead of n− type. Moreover, the transistor can be fabricated in a p-n-p arrangement by simply utilizing appropriately different layers, as is also well known in the art.

Although a preferred embodiment of the present invention has been shown and described in detail herein, many other varied embodiments that incorporate the teachings of the present invention may be easily constructed by those skilled in the art.

We claim:

1. A semiconductor magnetic field sensor comprising:
an emitter region having two emitter connections associated therewith for establishing a bias lateral majority carrier flow through said emitter region, wherein said bias majority carrier flow in said emitter region is oriented substantially perpendicular to both a direction of a magnetic field that is to be detected with the sensor and to a direction of transistor current that will flow through said sensor;
a base region adjoining at least a portion of said emitter region so as to form an emitter-base junction with a junction voltage occurring therebetween, said base region having two base connections associated therewith for establishing a bias lateral majority carrier flow through said base region, wherein said bias majority carrier flow in the base region is oriented substantially opposite to the direction to said bias majority carrier flow in the emitter region and substantially perpendicular to both the direction of the magnetic field and to the direction of the transistor current;
first and second collector regions oppositely situated on said base region, whereby, when said magnetic field is applied to said sensor in the presence of both of said bias lateral majority carrier flows, both of the bias lateral majority carrier flows will deflect in substantially the same direction so as to locally increase the junction voltage located in a vicinity of the first collector region and decrease the junction voltage located in a vicinity of the second collector region so as to exponentially increase the collector current that will flow through said first collector region and exponentially decrease the collector current that will flow through said second collector region.

2. The sensor in claim 1 wherein the emitter region is formed of a semiconductor material having a first conductivity type, the base region is formed of a semiconductor material having a second conductivity type and each of the collector regions is formed of a semiconductor material having a first conductivity type.

3. The sensor in claim 1 further comprising a floating region formed on said base region intermediate said first and second collector regions, wherein said floating region increases current density of the bias lateral majority carrier flow through said base region and passivates the otherwise exposed base region situated between the first and second collector regions.

4. The sensor in claim 3 wherein the emitter region is formed of a semiconductor material having a first conductivity type, the base region is formed of a semiconductor material having a second conductivity type and each of the collector regions is formed of a semiconductor material having a first conductivity type.

5. The sensor in claim 4 wherein said floating region is formed of a semiconductor material of said first conductivity type.

6. The sensor in claim 3 wherein said collector regions are located in the vicinity of oppositely situated edges of said base region.

7. The sensor in claim 1 wherein the transistor current flows in a direction that is substantially parallel to the direction of one component of said magnetic field.

8. A semiconductor magnetic field sensor comprising:
an emitter region having two emitter connections associated therewith for establishing a bias lateral majority carrier flow through said emitter region, wherein said bias majority carrier flow in said emitter region is oriented substantially perpendicular to both a direction of a magnetic field that is to be detected with the sensor and to a direction of transistor current that will flow through said sensor;
a base region adjoining at least a portion of said emitter region so as to form an emitter-base junction with a junction voltage occurring therebetween, said base region having two base connections associated therewith for establishing a bias lateral majority carrier flow through said base region, wherein said bias majority carrier flow in the base region is oriented substantially opposite to the direction to said bias majority carrier flow in the emitter region and substantially perpendicular to both the direction of the magnetic field and to the direction of the transistor current;
first and second collector regions oppositely situated on said base region, whereby, when said magnetic field is applied to said sensor in the presence of both of said bias lateral majority carrier flows, both of the bias lateral majority carrier flows will deflect in substantially the same direction so as to locally increase the junction voltage located in a vicinity of the first collector region and decrease the junction voltage located in a vicinity of the second collector region so as to exponentially increase the collector current that will flow through said first collector region and exponentially decrease the collector current that will flow through said second collector region; and wherein said sensor further comprises a floating region formed on said base region intermediate said first and second collector regions, wherein said floating region increases current density of the bias lateral majority carrier flow through said base region and passivates the otherwise exposed base region situated between the first and second collector regions.

9. The sensor in claim 8 wherein the emitter region is formed of a semiconductor material having a first conductivity type, the base region is formed of a semiconductor material having a second conductivity type and each of the collector regions and the floating region is formed of a semiconductor material having a first conductivity type.

10. The sensor in claim 9 wherein said collector regions are located in the vicinity of oppositely situated edges of said base region.

11. The sensor in claim 8 wherein the transistor current flows in a direction that is substantially parallel to the direction of one component of said magnetic field.

12. A semiconductor magnetic field sensor comprising:
an emitter region having two emitter connections associated therewith for establishing a bias lateral majority carrier flow through said emitter region, wherein said bias majority carrier flow in said emitter region is oriented substantially perpendicular to both a direction of a magnetic field that is to be detected with the sensor and to a direction of transistor current that will flow through said sensor;
a base region adjoining at least a portion of said emitter region so as to form an emitter-base junction with a junction voltage occurring therebetween, said base region having two base connections associated therewith for establishing a bias lateral majority carrier flow through said base region, wherein said bias majority carrier flow in the base region is oriented substantially opposite to the direction to said bias majority carrier flow in the emitter region and substantially perpendicular to both the direction of the magnetic field and to the direction of the transistor current;
first and second collector regions oppositely situated on said base region, whereby, when said magnetic field is applied to said sensor in the presence of both of said bias lateral majority carrier flows, both of the bias lateral majority carrier flows will deflect in substantially the same direction so as to locally increase the junction voltage located in a vicinity of the first collector region and decrease the junction voltage located in a vicinity of the second collector region so as to exponentially increase the collector current that will flow through said first collector region and exponentially decrease the collector current that will flow through said second collector region; and wherein said sensor further comprises:
a floating region formed on said base region intermediate said first and second collectors, wherein said floating region increases current density of the bias lateral majority carrier flow through said base region and passivates the otherwise exposed base region situated between the first and second collector regions; and
the emitter region is formed of a semiconductor material having a first conductivity type, the base region is formed of a semiconductor material having a second conductivity type and each of the collector regions and the floating region is formed of a semiconductor material having a first conductivity type.

13. The sensor in claim 12 wherein said collectors are located in the vicinity of oppositely situated edges of said base region.

14. The sensor in claim 12 wherein the transistor current flows in a direction that is substantially parallel to the direction of one component of said magnetic field.

15. A semiconductor magnetic field sensor comprising:
an emitter region;
a base region adjoining at least a portion of said emitter region so as to form an emitter-base junction with a junction voltage occurring therebetween;
said base region or said emitter region having two connections associated therewith for establishing a bias lateral majority carrier flow through said base region or said emitter region, respectively, such that said bias lateral majority carrier flow is oriented substantially perpendicular to both a direction of a magnetic field that is to be detected with the sensor and to a direction of transistor current that will flow through the sensor;
first and second collector regions oppositely situated on said base region, whereby, when said magnetic field is applied to said sensor in the presence of said lateral bias majority carrier flow, the bias lateral majority carrier flow will deflect in a direction so as to locally increase the junction voltage located in a vicinity of the first collector region and decrease the junction voltage located in a vicinity of the second collector region so as to exponentially increase the collector current that will flow through said first collector region and exponentially decrease the collector current that will flow through said second collector region.

16. The sensor in claim 15 wherein the emitter region is formed of a semiconductor material having a first conductivity type, the base region is formed of a semiconductor material having a second conductivity type and each of the collector regions is formed of a semiconductor material having a first conductivity type.

17. The sensor in claim 15 wherein said collectors are located in the vicinity of oppositely situated edges of said base region.

18. The sensor in claim 15 wherein the transistor current flows in a direction that is substantially parallel to the direction of one component of said magnetic field.

* * * * *